United States Patent [19]

Riebman

[11] Patent Number: 5,264,735
[45] Date of Patent: Nov. 23, 1993

[54] SUPERCONDUCTING NON-LINEAR DEVICE

[75] Inventor: Leon Riebman, Rydal, Pa.

[73] Assignee: AEL Defense Corp., Lansdale, Pa.

[21] Appl. No.: 671,589

[22] Filed: Mar. 19, 1991

[51] Int. Cl.[5] ............... H03K 17/92; H03D 9/00
[52] U.S. Cl. .................... 307/245; 307/306;
329/370; 333/995; 455/214; 505/860; 505/862;
257/31
[58] Field of Search ............ 307/245, 306; 324/119,
324/132, 248; 455/214; 329/370; 357/5; 505/1,
860, 862; 333/995

[56] References Cited

U.S. PATENT DOCUMENTS

| | | | |
|---|---|---|---|
| 1,992,410 | 2/1935 | Benkelman | 201/60 |
| 2,978,664 | 4/1961 | Walters | 338/217 |
| 2,989,715 | 6/1961 | Park, Jr. et al. | 307/245 |
| 3,327,273 | 6/1967 | Lee, III | 338/32 |
| 3,335,363 | 8/1967 | Anderson et al. | 307/245 |
| 4,754,384 | 6/1988 | Levy et al. | 307/245 |
| 4,963,852 | 10/1990 | Drehman | 307/245 |

FOREIGN PATENT DOCUMENTS 0177826  7/1989  Japan ................... 307/245

*Primary Examiner*—John Zazworsky
*Attorney, Agent, or Firm*—Seidel, Gonda, Lavorgna & Monaco

[57] ABSTRACT

A superconducting non-linear device comprising a superconducting conductor, a current source associated with the conductor for applying to the conductor a bias current, and a control device associated with the current source for selectably varying the bias current between a first value below the critical current for the conductor means and a second value above the critical current. The non-linear device is a switching device comprising a switching element in the form of a superconducting film, a terminal for inputting a signal to the switching element, a terminal for outputting a signal from the switching element, and a circuit for applying a DC bias current to the switching element and for causing the DC bias current to vary between a first value below the critical current for the superconducting film and a second value above the critical current. The non-linear device is a square-law detector device comprising a thin-film superconductor, a terminal for coupling an RF signal to be detected to an input zone of the superconductor, a circuit for applying a DC bias current to the superconductor, the bias current being of a value to constrain the superconductor to operate in the quadratic portion of its resistance-current operating characteristic, and a circuit for obtaining a detected output signal from an output zone of the superconductor.

6 Claims, 3 Drawing Sheets

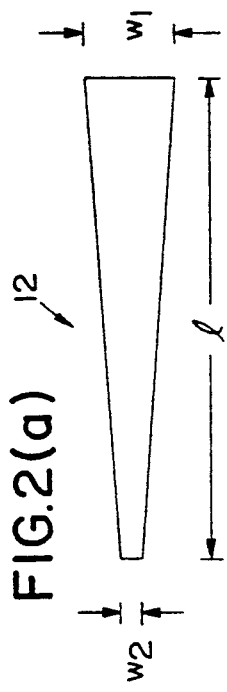 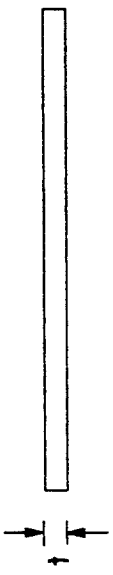
FIG.1(a) FIG.1(b)
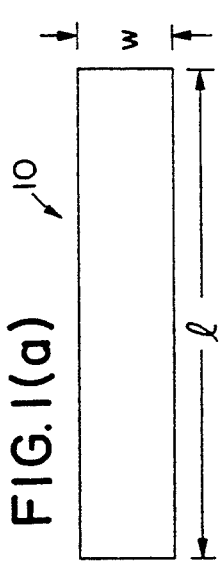 
FIG.2(a) FIG.2(b)
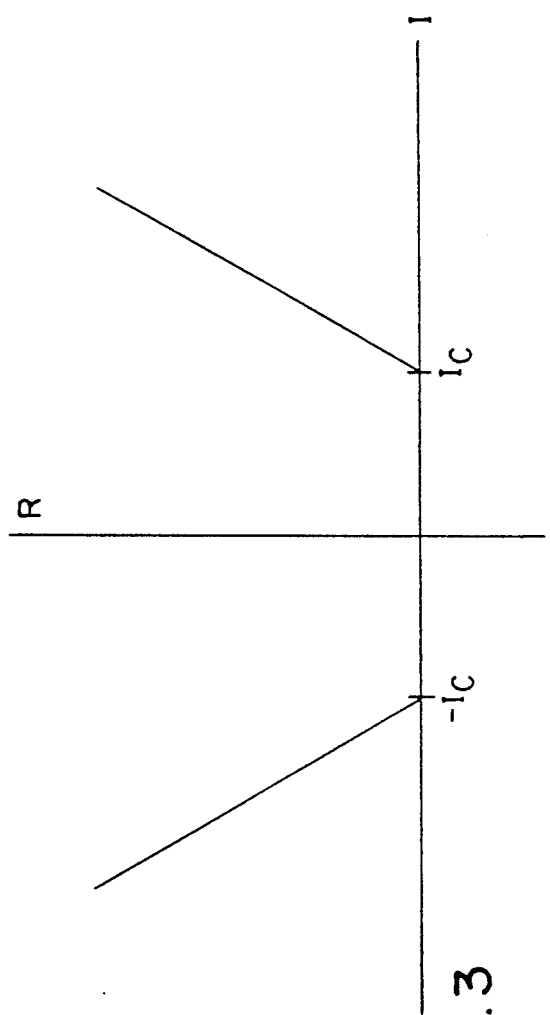
FIG.3

SUPERCONDUCTING NON-LINEAR DEVICE

FIELD OF THE INVENTION

The present invention pertains to the field of superconducting circuit devices that exhibit non-linear operating characteristics which make them applicable to switching and other uses such as current limiting, mixing, detecting and modulating ac signals, for example.

BACKGROUND OF THE INVENTION

Superconductivity is a phenomenon occurring at very low temperatures in many electrical conductors, in which the electrons responsible for conduction undergo a collective transition to an ordered state, of which superconductivity is a characteristic. This ordered state exhibits several unique and remarkable properties: disappearance of resistance to the flow of electric current, appearance of a large diamagnetism and other unusual magnetic effects, substantial alteration of many thermal properties, and the occurrence of quantum effects otherwise observable only at the atomic and subatomic level. The temperature below which a conductor begins to exhibit superconductivity is called the transition temperature or "critical temperature," usually designated $T_c$. Below the critical temperature, electrical resistance of low-temperature superconductors drops sharply to levels at least $10^{12}$ times less than at normal temperatures. In high-temperature superconductors in the microwave and millimeter wave regions, the resistance drops sharply to levels on the order of $10^3$ to $10^4$ times less than at normal temperatures.

Other phenomena beside the disappearance of electrical resistance are displayed by superconductors. One of these is the Meissner-Ochsenfeld effect, in which an applied magnetic field is excluded from the interior of the superconductor. As long as the magnetic flux in a superconductor is low, the superconductor will remain completely superconducting in an applied magnetic field. If the magnetic field becomes too large, however, the superconductor will become partially or totally normal. That is, when the magnetic field exceeds a "critical field," designated $H_{cl}$, the superconductor reverts to the normal state and its resistance to electric current rises sharply.

Related to the Meissner-Ochsenfeld effect is the phenomenon of penetration depth. The way in which a superconductor excludes from its interior an applied magnetic field smaller than the critical field $H_{cl}$ is by establishing a persistent supercurrent on its surface and inside the material to the penetration depth which exactly cancels the applied field inside the superconductor. This current flows in a very thin layer of thickness $\lambda$, which is called the penetration depth. The external magnetic field also penetrates the superconductor within the penetration depth. Lambda depends on the material and on the temperature, and is typically very small, on the order of 2000 to 5000 Angstroms.

The existence of the critical field leads to another property of superconductors which is of importance. A supercurrent flowing in a superconductor will itself create a magnetic field, and this field will drive the superconductor normal at some critical value of the current, called the critical current density, designated $J_c$. When the current in the superconductor exceeds the critical current density, the superconductor becomes normal and its resistance increases sharply.

These phenomena of superconductors can be put to practical applications. For example, a superconductor can be used as a switching device if it can be driven from the normal to the superconducting state and back again as desired. One way to change the state of a superconductor from superconducting to normal is to change the critical field. This approach is disclosed in U.S. Pat. No. 3,327,273, which discloses a gate element composed of a thin-film superconductor whose resistance is controlled by the application of an external magnetic field. By controlling the external magnetic field, the gate element can be driven from the superconducting to the normal state, and vice-versa.

These phenomena have also been exploited to create a variable resistance superconducting device, as shown in U.S. Pat. No. 2,978,664. This patent shows a tapered conductor of superconducting material which operates partially in the superconducting state and partially in the normal state. By tapering the conductor, there will eventually be a point at which the current density through it exceeds the critical current density, at which point the conductor becomes normal. By locating tap points along the tapered length of the conductor, different resistance behaviors can be obtained.

The present invention differs from the approaches shown in these patents in that the invention does not require any complex geometries or associated field generating apparatus such as coils and windings. The present invention provides a simple superconducting non-linear device that can be used for switching and other applications.

SUMMARY OF THE INVENTION

The present invention is a superconducting non-linear device comprising a superconducting conductor means, current source means associated with the conductor means for applying to the conductor means a bias current, and control means associated with the current source means for selectably varying the bias current between a first value below the critical current for the conductor means and a second value above the critical current.

In one embodiment of the present invention, the non-linear device is a switching device comprising a switching element in the form of a superconducting film, means for inputting a signal to the switching element, means for outputting a signal from the switching element, means for applying a DC bias current to the switching element, and means for causing the DC bias current to vary between a first value below the critical current for the superconducting film and a second value above the critical current.

In another embodiment of the invention, the non-linear device is a square-law detector device comprising a thin-film superconductor, means for coupling an RF signal to be detected to an input zone of the superconductor, means for applying a DC bias current to the superconductor, the bias current being of a value to constrain the superconductor to operate in the quadratic portion of its resistance-current operating characteristic, and means for obtaining a detected output signal from an output zone of the superconductor.

DESCRIPTION OF THE DRAWINGS

For the purpose of illustrating the invention, there is shown in the drawings a form which is presently preferred; it being understood, however, that this invention is not limited to the precise arrangements and instrumentalities shown.

FIGS. 1(a) and 1(b) illustrate a superconducting conductor of length 1, constant width w and thickness t.

FIGS. 2(a) and 2(b) illustrate a superconducting conductor of length l and thickness t, and whose width varies along its length from $w_1$ to $w_2$.

FIG. 3 is an idealized graph of resistance as a function of current for a typical superconductor.

DESCRIPTION OF THE INVENTION

Figure 4:
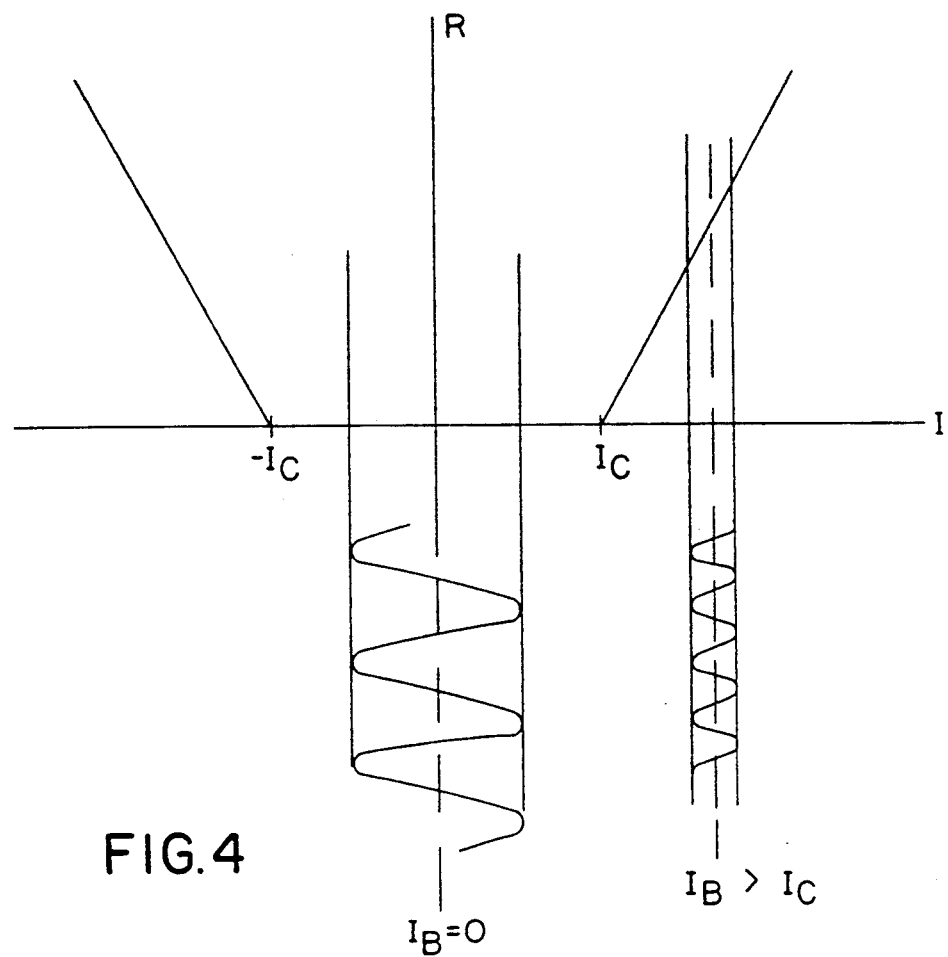
FIG. 4 is a graph of the resistance-current characteristic for a typical superconductor, illustrating the switching behavior of the non-linear device of the present invention.

Referring now to the drawings, there is shown in FIG. 1 a typical superconductor 10. FIG. 1(a) is a top plan view, and FIG. 1(b) is a side elevation view thereof. Superconductor 10 may be thought of as a thin-film superconductor having a length l, a width w and a thickness t. Length l and width w are arbitrary, and thickness t is typically on the order of 4000 to 5000Å. Width w and thickness t are assumed to be constant along the length l of superconductor 10. Hence, the resistance of superconductor 10 is constant everywhere along length l. Preferably, although not necessarily, the dimensions of superconductor 10 are chosen so that the current density (current divided by cross-sectional area) always yields a current below the critical current.

FIG. 2 illustrates a slightly modified form of thin-film superconductor. In FIG. 2, superconductor 12 has a given length l and thickness t, but the width of superconductor 12 decreases from $w_1$ to $w_2$ from right to left along length l. This results in a superconductor whose current density increases from right to left as the cross-sectional area decreases from right to left. The maximum current density in superconductor 12 may or may not yield a current in excess of the critical current density, depending on the particular values of width and thickness. It should be noted, however, that the invention does not rely on changes in area to control the value of current in the superconductor. The advantage of the modified form of superconductor 12 is that it provides the ability to obtain different resistance characteristics from a single element, depending on where electrical connections are made to superconductor 12 along its length.

Preferably, but not necessarily, for either superconductor 10 (FIG. 1) or 12 (FIG. 2), the superconductor has a square transverse cross-section. That is, the cross-section through the superconductor in a plane transverse to the length l of the superconductor is a square. In such a case, the sides of the square have a dimension defined by $$\frac{4H_{c1}}{J_c} \quad (1)$$

where $H_{c1}$ is the critical field and $J_c$ is the critical current density. Although it is not necessary that the cross-section of superconductors 10 or 12 have a square configuration defined by this dimension, it is believed that by utilizing a square cross-section of these dimensions it is possible to achieve a non-linear resistance characteristic, as described in greater detail below, at a minimum of current. However, it should be realized that a square cross-section is not absolutely vital to the present invention, and that non-square cross-sections are also within the scope of the invention.

A typical resistance characteristic for a thin-film superconductor of a given cross-sectional area is illustrated in FIG. 3. The curve in FIG. 3 is a graph of the resistance (R) of the superconductor as a function of the current (I) through it. As seen in FIG. 3, the superconductor has a region of substantially zero resistance for values of current below the critical current $I_c$. Critical current $I_c$ is a function of critical current density $J_c$ and the cross-sectional area of the superconductor, as will be understood by those skilled in the art. Once current begins to exceed $I_c$, the superconductor ceases to superconduct, and its resistance rises sharply. The curve in FIG. 3 has been idealized to a linear relationship between resistance and current, i.e., $$R = aI \text{ for } I > I_c \quad (2)$$

where a is a constant for a given superconductor. Although the exact relationship between resistance and current may be different for different superconductors, the assumption of a linear relationship between resistance and current is sufficient for purposes of describing the present invention.

In addition, there is typically a quadratic portion of the resistance characteristic in the vicinity of the critical current, where the resistance is approximately $$R = kI^2 \quad (3)$$

where k is a constant for the superconductor. This region is omitted from FIG. 3 for clarity, but will be described further hereinbelow.

The resistance characteristic shown in FIG. 3 makes it possible to use a thin-film superconductor as a switching device. Referring now to FIG. 4, the resistance characteristic of FIG. 3 is shown with sinusoidal signals superimposed thereon to represent time-varying signals to be switched by the superconductor. The signals may be any type of signal desired to be switched, such as RF signals for radar or communications. The frequency distribution and waveform of the signals is not critical. Thus, although the signals are illustrated as pure sinusoids, they may be any form of signals such as a modulated carrier, radar pulses, and the like.

In order to cause the superconductor to operate as a switch, a DC bias current $I_B$ is applied to it. By controlling the amplitude of the bias current, the superconductor can be operated in either its superconducting state or its normal state. That is, for bias currents less than the critical current, for example $I_B = 0$, the superconductor will remain superconducting as long as the amplitude of the time-varying signal is less than the critical current. Under these conditions, the superconductor has effectively zero resistance and appears as a closed switch to a signal applied to it. For bias currents above the critical current, that is, for $I_B > I_c$, the superconductor will be normal and will exhibit a high resistance. Thus, the superconductor will appear as an open switch to a signal applied to it, so long as the applied signal does not reduce the current below the critical current $I_c$.

Figure 5:
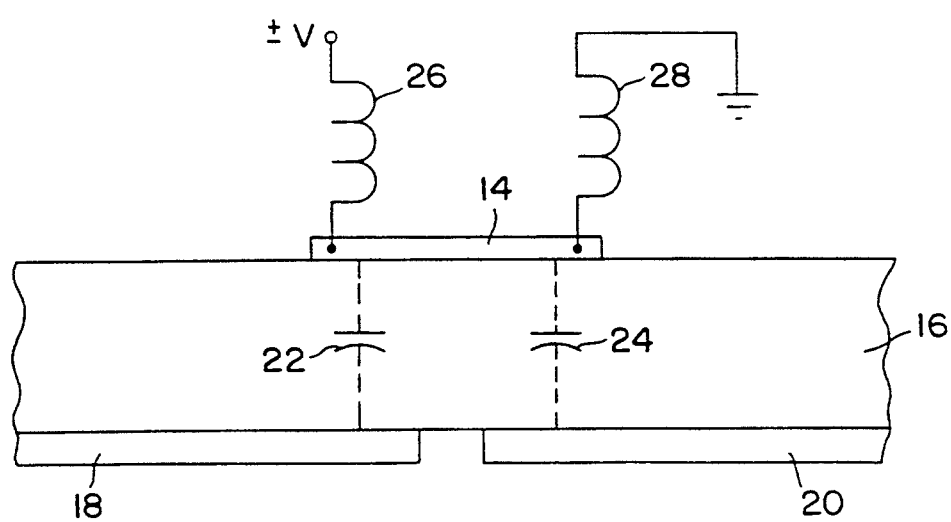
FIG. 5 is a simplified diagram of a switching device according to one embodiment of the invention.

One construction for exploiting this switching behavior of a superconductor is illustrated in FIG. 5. In FIG. 5 there is shown a thin-film superconductor 14 disposed on one side of a substrate 16. Substrate 16 is generally planar, and the sides of the substrate on which are disposed the thin film superconductors are generally planar. A first signal conductor 18 is disposed on the opposite side of substrate 16 and extends below superconductor 14 so as to "sandwich" a portion of substrate 16 between superconductor 14 and first signal conductor 18. A second signal conductor 20 is also disposed on the opposite side of substrate 16 and likewise extends below superconductor 14 to "sandwich" a portion of substrate 16 between superconductor 14 and second signal conductor 20. Signal conductors 18 and 20 may, but need not, be superconductors. Signal conductor 18 may be thought of as the input connection to superconductor 14 and signal conductor 20 as the output connection, although the opposite relationship may exist depending upon the exact direction of signal flow. The exact direction of signal flow is not critical.

As seen in FIG. 5, and as noted above, there is a portion of substrate 16 between conductors 18 and 20 and superconductor 14. This permits capacitive coupling of high-frequency signals from conductor 18 to superconductor 14 and from superconductor 14 to conductor 20, while blocking DC signals. The capacitive coupling between the conductors is illustrated by capacitors 22 and 24, shown in phantom in FIG. 5. Thus, high-frequency signals are coupled at low impedance from conductor to conductor, while DC signals in any one conductor are prevented from coupling to another conductor.

Because of the capacitive coupling between conductors, a DC bias can be applied to superconductor 14 without affecting the signals on conductors 18 and 20. The DC bias on superconductor 14 can be used to permit superconductor 14 to operate in the superconducting state or to drive superconductor 14 to the normal state by applying a DC bias current which exceeds the critical current for superconductor 14. A DC bias can be readily applied to superconductor 14 from a DC source +V or −V to ground through a pair of high-frequency chokes 26 and 28. Choke 26 is connected at one end of superconductor 14 and choke 28 is connected at the other. This provides a series circuit between +V or −V and ground with very low DC resistance but very high impedance at high frequencies due to the presence of chokes 22 and 24. Chokes 22 and 24 thus substantially prevent coupling of the high-frequency signals on conductors 18 and 20 from coupling to the source or to ground.

It will be appreciated that, by selecting the amplitude of the voltage from source +V or −V, a DC bias current of any desired magnitude can be made to flow through superconductor 14, which can thus be made to act as a switch. By causing no DC bias current to flow through superconductor 14, it will have a very low resistance and appear as a closed switch to a high-frequency signal on conductor 18. The high-frequency signal on conductor 18 will thus be coupled through superconductor 14 to conductor 20. By causing a DC bias current sufficiently greater than the critical current to flow through superconductor 14, it will have a very high resistance and appear as on open switch to a high-frequency signal on conductor 18. By appropriately designing the output circuit connected to conductor 20 to have the desired output impedance, the high-frequency signal on conductor 18 will thus be coupled to conductor 20 only with an extremely high degree of attenuation, so that effectively no coupling occurs from conductor 18 to conductor 20.

In short, superconductor 14 can be made to act as an effective switching device simply by controlling the DC current through it. This permits the construction of a simple and easy to operate superconducting switching element using only a minimum number of parts and which can be conveniently fabricated using conventional fabrication methods.

Figure 6:
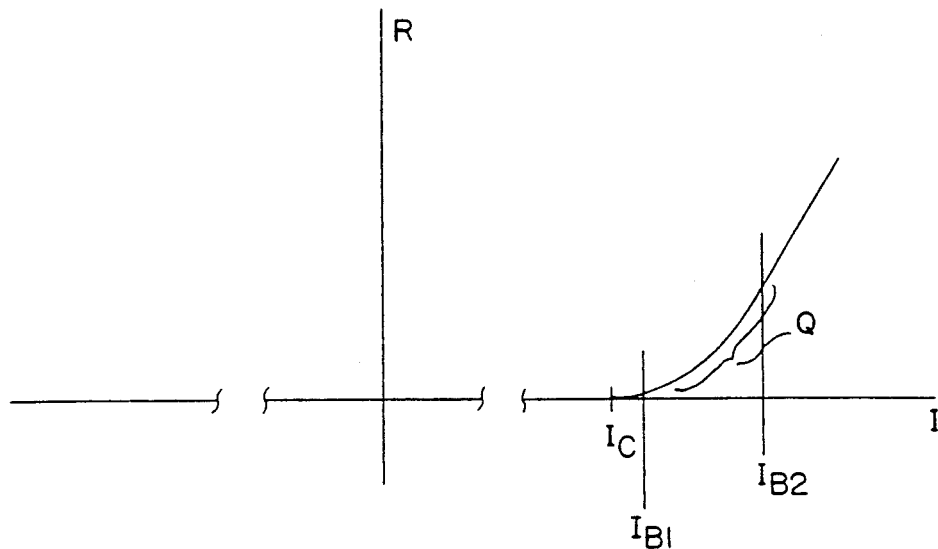
FIG. 6 is a portion of the graph of FIG. 3 on an enlarged scale, showing a portion of the graph that exhibits quadratic, or square-law, behavior.

A thin-film superconductor as shown in FIGS. 1 and 2 can also be made to operate as a square-law detector device by biasing the superconductor to operate on the quadratic portion of its resistance-current characteristic. As already mentioned hereinabove, the resistance-current characteristic of a thin-film semiconductor has a region which exhibits quadratic behavior, as expressed in equation (3) above. This region of quadratic behavior is illustrated in FIG. 6, which shows the quadratic region Q of the resistance-current characteristic on an enlarged scale. As can be seen in FIG. 6, there is a range of bias currents from $IB_1$ to $IB_2$ in which the resistance varies as approximately the square of the current flowing through the superconductor. By biasing the superconductor to operate in the range between $IB_1$ and $IB_2$, the superconductor will behave as a square-law device for input signals of small current amplitudes, i.e., for current amplitudes that do not result in the total current through the superconductor being outside the quadratic region Q. This behavior permits the superconductor to be used as a square-law detector, mixer, frequency converter and the like.

Figure 7:
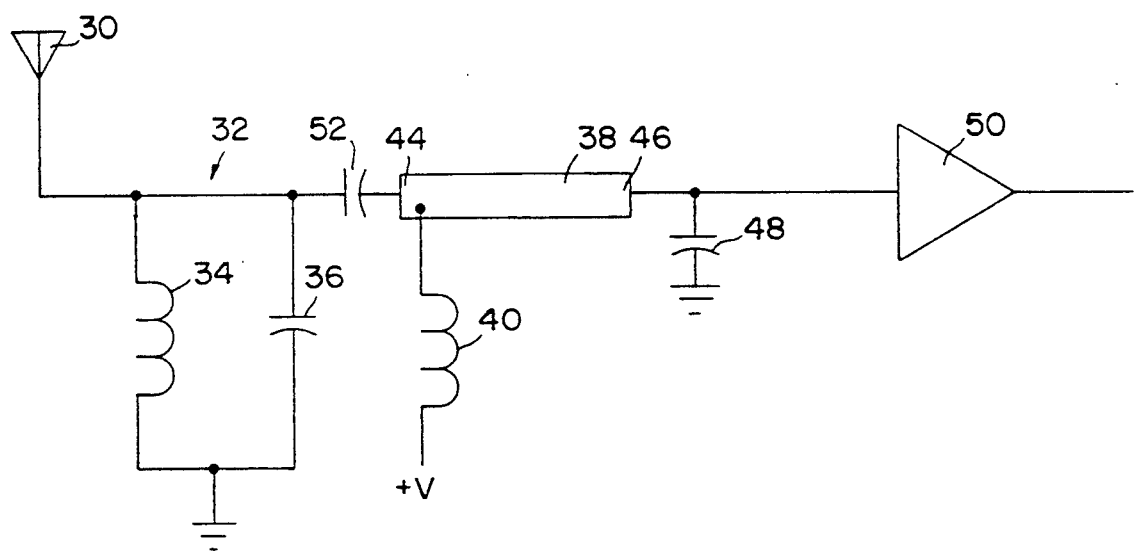
FIG. 7 is a simplified diagram of a square law detector according to the present invention.

A detector circuit employing a superconductor biased to its quadratic operating region is schematically illustrated in FIG. 7. The detector circuit comprises an antenna 30 which receives signals to be detected, such as modulated RF signals. Antenna 30 may be any type of antenna suitable for the signals to be detected. The output of antenna 30 is applied to an RF bandpass filter or tuner 32, which comprises an inductor 34 and a capacitor 36 in parallel between the antenna output and ground. Bandpass filter 32 determines which carrier frequencies will be passed to the square-law detector device. Filter 32 may be made tunable by making either inductor 34 or capacitor 36, or both, variable. The modulated RF signal passed by bandpass filter 32 is applied to the input of a square-law detector device in the form of a thin-film superconductor 38. The filtered RF signal is AC coupled through a series capacitor 52 as shown, or through an RF transformer.

Superconductor 38 is biased to an operating point in its quadratic operating region by a DC bias current supplied from a source +V or −V through an RF choke 40 to ground. (It is assumed that the input circuit of amplifier 50, discussed below, provides a return to ground for the DC bias current.) RF choke 40 provides substantially no DC resistance to the bias current, but presents a high impedance to the RF, so that RF energy is not coupled to the source or to ground.

The filtered RF signal is applied to an input end 44 of superconductor 38. The opposite end of superconductor 38 constitutes an output end 46. By properly choosing the bias current, and hence the operating point, of superconductor 38, it will behave as a square-law diode rectifier. As a result, the output from superconductor 38 will be a pulsating DC signal containing two components, one being the RF signal and the other the modulating signal. The RF component is removed by capacitor 48, which is chosen to provide a low RF impedance to ground. The modulating signal, which is the portion of the signal containing the information to be detected, is applied to an amplifier 50. The amplified signal from amplifier 50 can then be processed in other circuitry as desired.

The present invention may be embodied in other specific forms without departing from the spirit or essential attributes thereof and, accordingly, reference should be made to the appended claims, rather than to the foregoing specification, as indicating the scope of the invention.

I claim:

1. A switching device comprising
   a. a generally planar non-conductive substrate having first and second planar surfaces,
   b. a thin-film superconducting switching element on one of said planar surfaces,
   c. an input signal conductor and an output signal conductor on the other of said planar surfaces, said input and output signal conductors being capacitively coupled to the switching element through the substrate so as to be substantially in series with the switching element, and
   d. means for causing a preselected DC bias current to flow through the switching element, said DC bias current being selectable between a first value substantially below the critical current for the switching element and a second value substantially above the critical current.

2. A switching device according to claim 1, wherein the thin film superconducting switching element has a transverse cross-section in the shape of a square.

3. A switching device according to claim 2, wherein each side of the square has a length defined by the relation $4H_{c1}/J_c$.

4. A square-law detector device comprising
   a. a thin-film conductor of superconducting material having a resistance-current operating characteristic including a quadratic region,
   b. means for coupling an RF signal to be detected to an input zone of the conductor,
   c. means for applying a DC bias current to the conductor, said bias current being of a value to constrain the conductor to operate in the quadratic region of its resistance-current operating characteristic, and
   d. means for obtaining a detected output signal from an output zone of the conductor.

5. A square law detector device according to claim 4, wherein the thin film conductor has a transverse cross-section in the shape of a square.

6. A square law detector device according to claim 5, wherein each side of the square has a length defined by the relation $4H_{c1}/J_c$.

* * * * *